United States Patent
Godard et al.

(10) Patent No.: US 8,112,699 B2
(45) Date of Patent: Feb. 7, 2012

(54) ERROR DETECTING/CORRECTING SCHEME FOR MEMORIES

(75) Inventors: Benoit Godard, Aix en Provence (FR); Jean Michel Daga, Pynier (FR)

(73) Assignee: Atmel Rousset S.A.S. (FR)

(*) Notice: Subject to any disclaimer, the term of this patent is extended or adjusted under 35 U.S.C. 154(b) by 1013 days.

(21) Appl. No.: 12/031,289

(22) Filed: Feb. 14, 2008

(65) Prior Publication Data
US 2009/0210774 A1   Aug. 20, 2009

(51) Int. Cl.
*G06F 11/00* (2006.01)
*G11C 29/00* (2006.01)
(52) U.S. Cl. ....................... 714/800; 714/763
(58) Field of Classification Search .......... 714/746, 714/752, 758, 763, 799
See application file for complete search history.

(56) References Cited

U.S. PATENT DOCUMENTS

| | | | | |
|---|---|---|---|---|
| 5,410,546 A | * | 4/1995 | Boyer et al. | 714/763 |
| 7,213,191 B2 | * | 5/2007 | Chao | 714/758 |
| 7,779,341 B2 | * | 8/2010 | Kim | 714/801 |

* cited by examiner

*Primary Examiner* — Shelly A Chase
(74) *Attorney, Agent, or Firm* — Fish & Richardson P.C.

(57) ABSTRACT

A method for detecting and correcting errors in a memory having a read/write paradigm is presented. In these implementations, various approaches to detect errors on a per word or per group of words basis and correct errors on a per group of words or per page basis, respectively, in relation to a memory and its associated differing read/write operations, are provided. For instance, in one implementation, errors are detected on a per word basis and corrected on a per page basis for a NOR Flash Memory having differing read/write operations of reading on a per word basis and writing on a per page basis. Advantageously, benefits of the various implementations include reduced encoder/decoder complexities, reduced parity overhead requirements, and reduced performance degradation.

25 Claims, 8 Drawing Sheets

ERROR DETECTING/CORRECTING SCHEME FOR MEMORIES

FIELD OF THE INVENTION

The present invention relates generally to error correction and more particularly to detecting and correcting errors in a memory.

BACKGROUND OF THE INVENTION

Traditional memory error correction schemes have involved approaches for detecting errors using an error detecting code and correcting the detected errors using an error correcting code. These traditional approaches often insert parity bits for each word of a page of the memory to detect single-bit errors via the error detection capacity of an error correcting code, and thereafter correct the detected single-bit errors via the error correction capacity of the error correcting code. These approaches are often tried to improve the reliability of the content of a page of memory, for instance.

Unfortunately, these approaches have proved limiting as their techniques are often overly burdensome in their requirements for overhead and power consumption. For instance, substantial overhead burdens result for NOR Flash Memories, as all of the words of a page of memory and/or each added detection parity bit per word is required to be read as part of the error detection scheme to detect an error per word. These techniques are also inadequate for memories having read operations which differ from their programming (i.e., write) operations, such as the NOR Flash Memory. Similarly, attempts to overcome the inefficiencies by various improvement schemes have also proven inadequate.

SUMMARY OF THE INVENTION

Various implementations of an invention for detecting and correcting errors in relation to read operations which differ from write operations of a memory are provided. In one or more implementations, a method for detecting and correcting errors in a memory is set forth. Such implementations include determining word parity for one or more words on a page of the memory, determining page parity, and detecting and correcting one or more errors by reading one or more words in relation to a read operation of the memory. One or more implementations further include writing an output to the memory.

Advantageously, benefits of the various implementations include reduced encoder/decoder complexities, reduced parity overhead requirements, and reduced performance degradation.

BRIEF DESCRIPTION OF THE DRAWINGS

Further advantages of the various implementations will be apparent to those of ordinary skill in the art in view of the following detailed description in which.

DETAILED DESCRIPTION

The following description is presented to enable one of ordinary skill in the art to make and use the invention, including its various implementations, and is provided in the context of a patent application and its requirements. Various modifications to the embodiments, implementations, and the generic principles and features described herein will be readily apparent to those skilled in the art. Thus, the invention is not intended to be limited to the embodiments, implementations and examples shown, but is to be accorded the widest scope consistent with the principles and features described herein.

Parity Bits Calculation

In one or more implementations, detecting and correcting errors in relation to read operations which differ from write operations of the memory are provided. Various implementations detect errors on a per word basis and the detected errors are then corrected on a per page basis for a memory having differing read/write operations. For instance, a differing read/write operation may include reading, in the read operation, on a per word basis and writing, in the write operation, on a per page basis.

Figure 1:
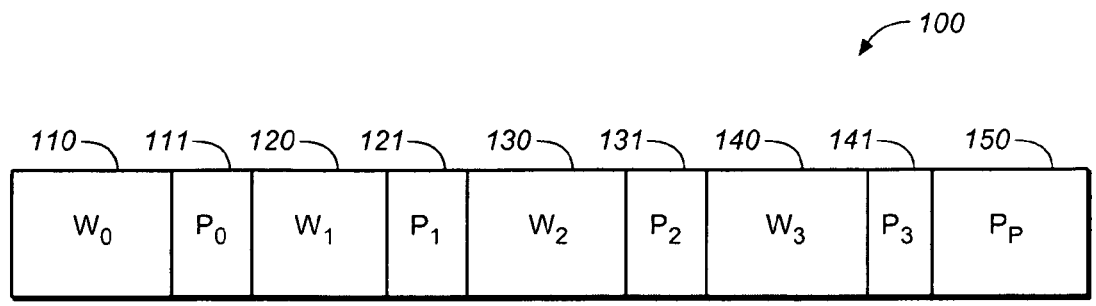
FIG. 1 depicts a page architecture of a NOR Flash Memory in one implementation where parity bits are positioned at predetermined locations on a page.

FIG. 1 depicts a page architecture of a NOR Flash Memory 100 in one implementation where parity bits are positioned at predetermined locations on a page. From FIG. 1, the page 100 shows various words (110, 120, 130 and 140), parity bits (111, 121, 131 and 141), and a page parity having one or more bits (150). Further, as reference for FIG. 1 and as used hereinafter, the following symbols are further defined as: "$W_0, \ldots, W_{W-1}$" are the "w" words, where "w" is the number of words per page; "$P_0, \ldots, P_{W-1}$" are word parities and equal the number of words, "w;" "$P_p$" is the page parity and comprises one or more parity bits defined as the number "p."

From FIG. 1, in accordance with the implementation, each word has a single parity bit (defined as "word parity") that provides for the detection of one error per word, and "p"

parity bits for the page (defined as "page parity") that provides for correction of up to one error in the page.

Although FIG. 1 sets forth a NOR Flash Memory, other memories may also benefit from various implementations herein where such memories also exhibit differing read/write operations.

Parity Bits Computation Using Parity Matrix Construct

To determine the number of parity bits needed, as in that of FIG. 1 for example, a computation based on a matrix construct and a page vector is determined, where the matrix construct provides for the sharing of parity bits in relation to a set of generator rules. In the construct, parity bits are to be shared as between the steps or code of error detection ("parity encoding") and error correction ("Hamming encoding"). Further, the set of generator rules ("generator rules"), of which the construct is constrained, includes:

a. the number of columns of the matrix, providing a one bit parity encoding for word parity computation, is equal to the number of words in the page, s; and, b. the matrix forms a Hamming Generator matrix with at least two 1's on each line of the matrix where each row is linearly independent from another.

Figure 2:
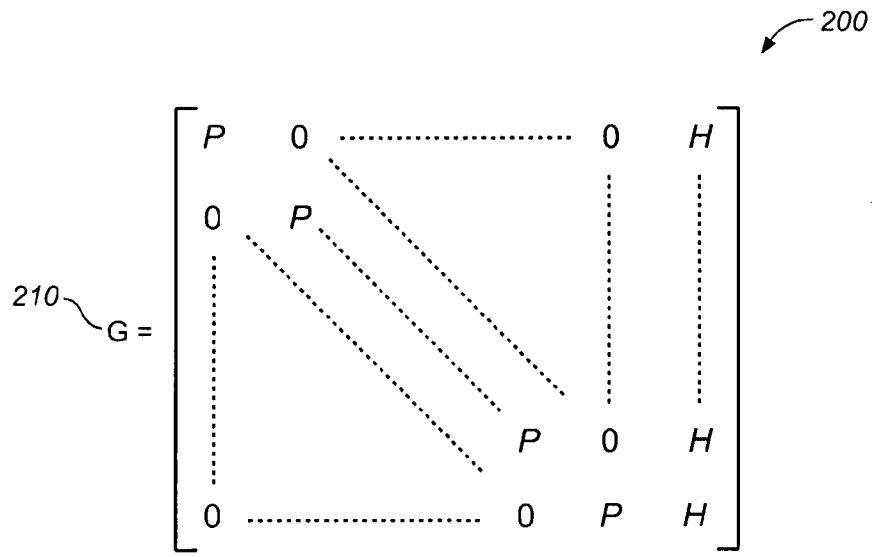
FIG. 2 depicts a matrix construct for an implementation providing for the sharing of parity bits in relation to a set of generator rules.

FIG. 2 depicts a matrix construct 200 for an implementation providing for the sharing of parity bits in relation to a set of generator rules. In constructing the matrix, defined as G at 210, the generator rules were followed, such as in relation to the number of words in the page, and the matrix G was generated. From FIG. 2, the following depicted terms are defined as: "P" is a column vector performing one error parity encoding, having length "k" containing 1's, where "k" is the number of bits per word; "H" is a partial Hamming Generator Matrix which is repeated an amount equal to the number of words in the page. "P" and "H" are used frequently in the matrix G to decrease encoding/decoding architecture requirements for the various implementations. Additionally, though not depicted in FIG. 2, the use of the term "b" is intended to be a bit.

Parity Computation

Having determined the matrix G, a page vector for the memory is then determined, such that the computational product of the matrix G and the page vector determines the number of parity bits via a parity vector.

For an implementation, a page vector is defined as $[W_0 \ldots W_{W-1}]$, where $[W_0]=[b_0^0 \, b_1^0 \ldots b_{k-1}^0]$, $[W_{W-1}]=[b_0^{w-1} \, b_1^{w-1} \ldots b_{k-1}^{w-1}]$). Then performing the computation of multiplying the page vector by the matrix G, ($[W_0 \ldots W_{W-1}] \times G$), a parity vector is determined. The parity vector product includes:

a. "w" word parity bits in the first "w" columns in relation to $P_0=W_0P$, $P_1=W_1P \ldots P_{w-1}=W_{w-1}P$; and, b. "p" page parity bits in the "p" last columns corresponding to $P_p=(W_0+W_1+\ldots+W_{w-1}) \times H$; where, c. $P_0, \ldots, P_{W-1}$ (i.e., "w" word parities) is computed independently from each other so only one word may be read with its associated word parity to detect if there is an error present.

Therefore, the number of parity bits is computed as:

a. Word parity bits="w"; and, b. Page parity bits=$\log_2(k)+1$; where, c. Total parity bits needed=$(w+\log2(k)+1)$ to provide 1 error detection per word and 1 error correction per page.

Parity Computation Example

Figure 3:
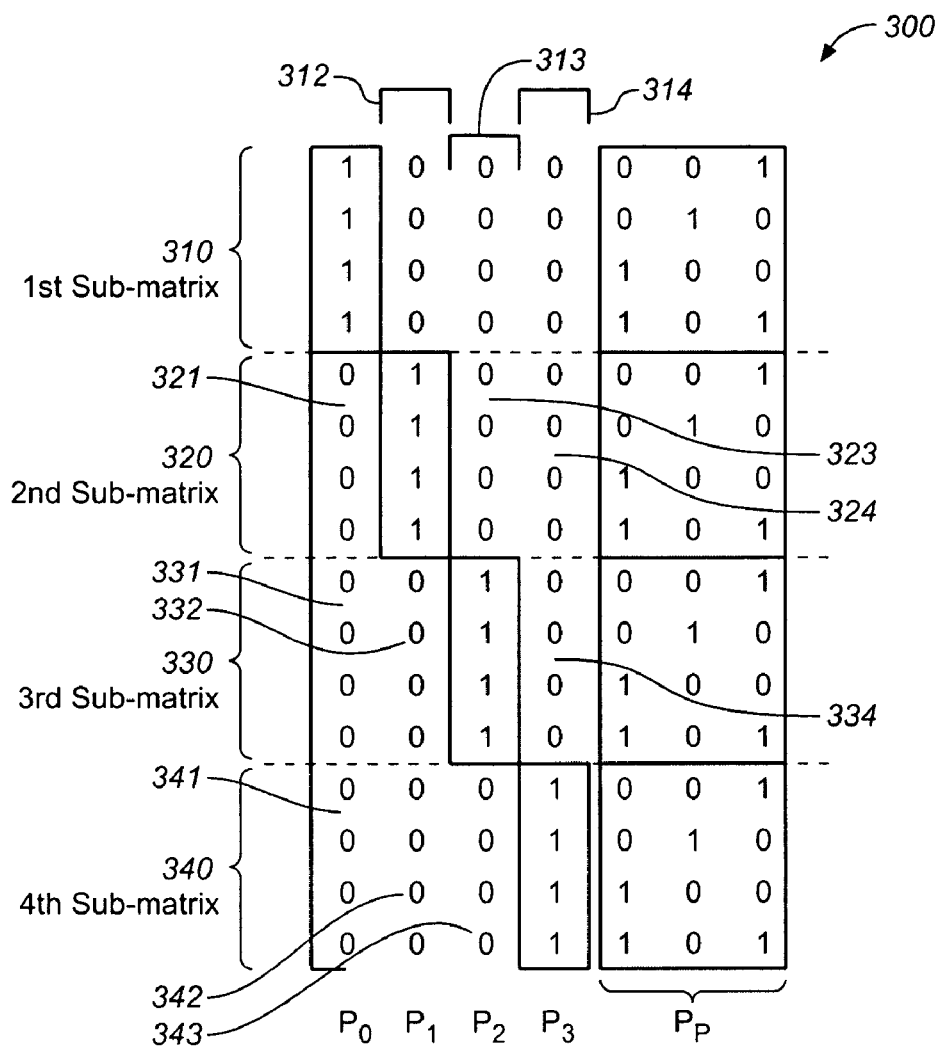
FIG. 3 depicts a parity matrix in accordance with one or more implementations for the particular example of four words each having four bits.

By example ("Example 1"), for one implementation, given four (4) words per page (i.e., "w"=4), where each word contained four (4) bits (i.e., "k"=4), the matrix is constructed to be the matrix set forth in FIG. 3. FIG. 3 depicts a parity matrix 300 in accordance with one or more implementations for the particular example of four words each having four bits of Example 1.

From FIG. 3, the number of columns providing a one bit parity encoding for word parity computations equals the number of words in the page. Further, from FIG. 3, the matrix also satisfies the generator rules such as the condition that the matrix formed be a Hamming Generator matrix having at least two 1's on each line of the generator matrix where each row is linearly independent from another. Additionally the matrix 300 is further decomposable into a set of four sub-matrices depicted at 310, 320, 330 and 340.

In the first sub-matrix of FIG. 3, at 310, columns 2, 3 and 4 (312, 313, and 314 respectively) are each null. In the second sub-matrix of FIG. 3, at 320, columns 1, 3 and 4 (321, 323, and 324 respectively) are each null. In the third sub-matrix of FIG. 3, at 330, columns 1, 2, and 4 (331, 332, and 334 respectively) are each null. In the fourth sub-matrix of FIG. 3, at 340, columns 1, 2, and 3 (341, 342, and 343 respectively) are each null. The resulting equivalence in each of the sub-matrices is further depicts that there exists significant optimization of the corresponding encoding and decoding architecture by the various implementations.

Accordingly, using Example 1 from above, the computations result as:

a. Word parity bits=4, b. Page parity bits=3, and c. Total Parity bits=7.

Therefore, from FIG. 1, each word parity block (111, 121, 131, and 141) comprises 1 word parity bit and the page parity block (150) comprises three parity bits. This result provides a reasonable overhead without undue burden and further provides an error detection/correction parity scheme complementary to the differing read/write operations of the memory.

Encoding and Parity Bit Insertion

In various implementations, an architecture for error protection, including an encoder and an error detector and corrector (EDC), is provided.

Encoder for Error Protection

Figure 4:
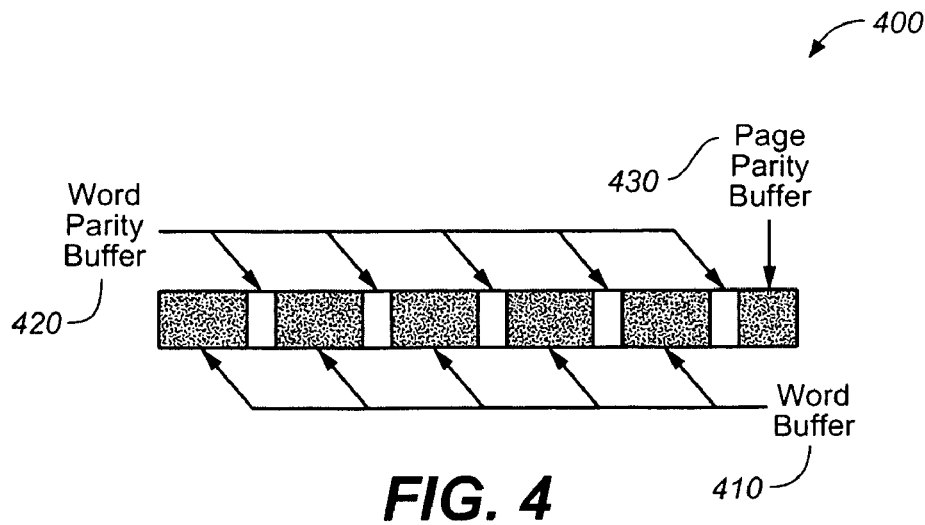
FIG. 4 depicts the page buffer which includes a word buffer, a word parity buffer, and a page parity buffer, in accordance with an implementation.

By example, in an operational implementation, a process for writing a page into the memory is provided where words intended for writing are first loaded into a word buffer of a page buffer and then written following a user command. FIG. 4 depicts the page buffer 400 which includes a word buffer 410, a word parity buffer 420, and a page parity buffer 430, in accordance with an implementation. Data that has been externally provided is written to the memory array via the page buffer 400 and data that has been read from the memory array is externally output via the page buffer 400. The page buffer 400 is in signal communication with the memory array via bit lines. The page buffer 400 is further depicted in a portion of a flash memory system in accordance with an implementation.

Figure 5:
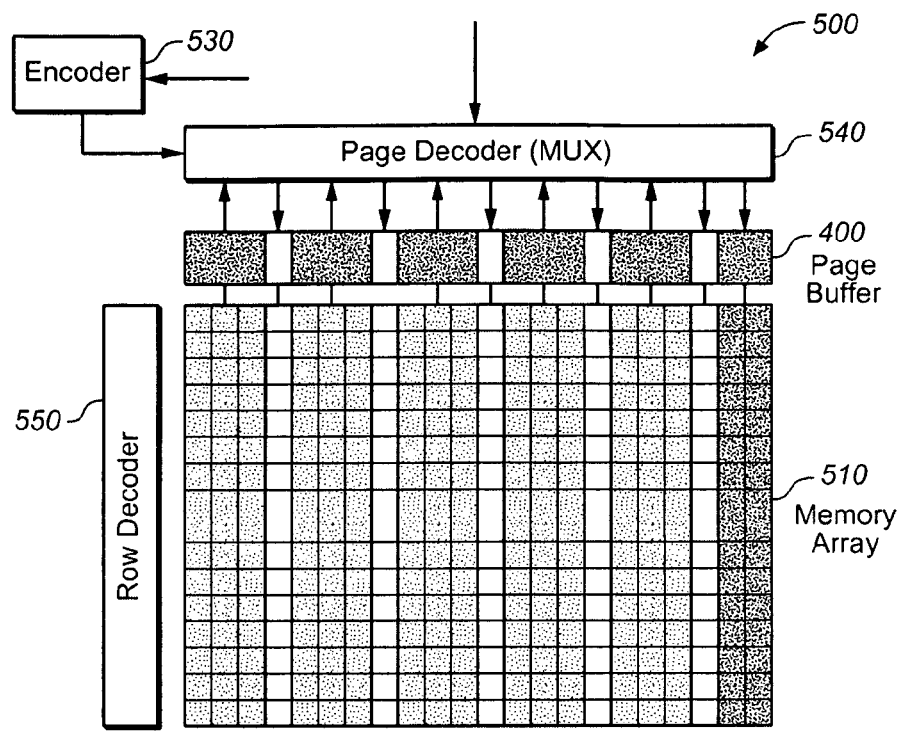
FIG. 5 depicts a memory system comprised of a memory array, a page buffer, an encoder and a decoder, in accordance with an implementation.

FIG. 5 depicts a memory system 500 comprised of a memory array 510, a page buffer 400 and an encoder 530. Further, FIG. 5 also depicts a page decode (MUX) 540 in communication with the encoder 530 and a row decoder 550. The encoder 530, in various implementations, is further comprised of a parity encoder controller 630 and a parity encoder 620, and is further detailed as depicted in FIG. 6 for the parity encoder and controller architecture.

In various implementations, the memory system 500 may comprise a controller and a flash memory device having the memory array 510, wherein the controller further comprises a processor, a memory control portion, and an error detection/correction circuit of one or more embodiments herein. It will be appreciated by those skilled in the art that the processor in various implementations may control the controller, though software or circuitry may also control the controller.

Figure 6:
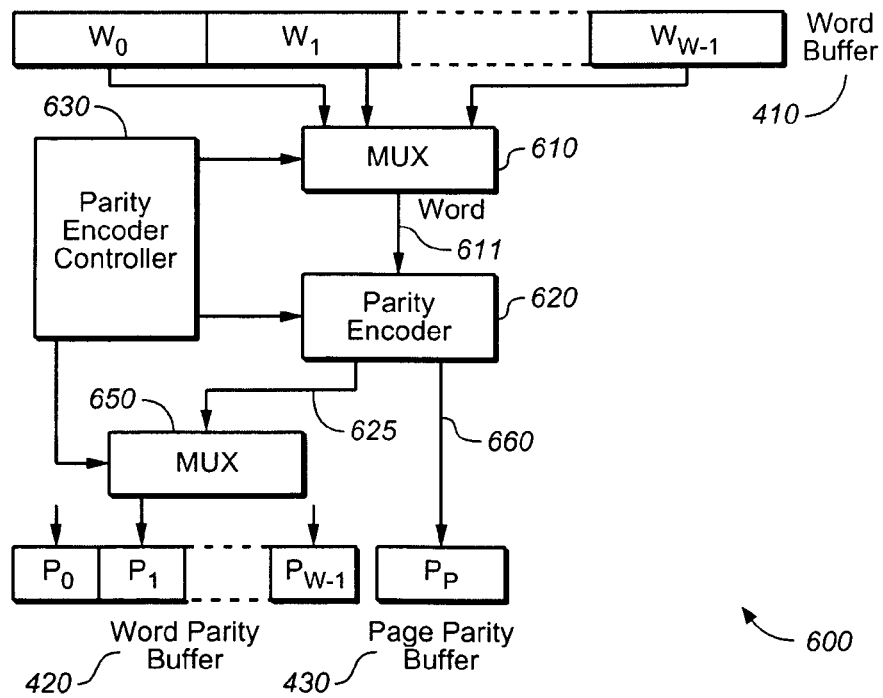
FIG. 6 depicts an architecture for the parity encoder and parity encoder controller in accordance with an implementation.

FIG. 6 depicts an architecture 600 for the parity encoder 620, and parity encoder controller 630, in accordance with an implementation. FIG. 6 also further sets forth the architectural relation between the word buffer 410, the word parity buffer 420 and the page parity buffer 430, previously discussed in FIG. 4.

From FIG. 6, via the encoding step, for each word set forth in the word buffer at 410, a word parity bit (such as that of FIG. 1 by example) is computed from a parity encoder 620 controlled by a parity encoder controller 630. Each word in the word buffer 410 is inserted into the parity encoder 620 via the MUX 610 via line 611. The MUX 610 is controlled by the parity encoder controller 630. The parity encoder 620 computes the word parity 625 and the page parity 660. The word parity bit 625, after being computed, is inserted in a word parity buffer 420 via the MUX 650 which is controlled by the parity encoder controller 630. In parallel, or concurrently, a page parity 660 having one or more parity bits, is also computed by the parity encoder 620. Once all words in the word buffer 410 have been processed by the parity encoder 620 via the MUX 610, the page parity 660 is determined and the page parity bit(s) is inserted in the page parity buffer 430. Thereafter, once all parity values have been computed and inserted into their respective buffers, the write operation is performed. The parity encoder 620 is further detailed in an implementation in FIG. 7.

Detailed Parity Encoder

Figure 7:
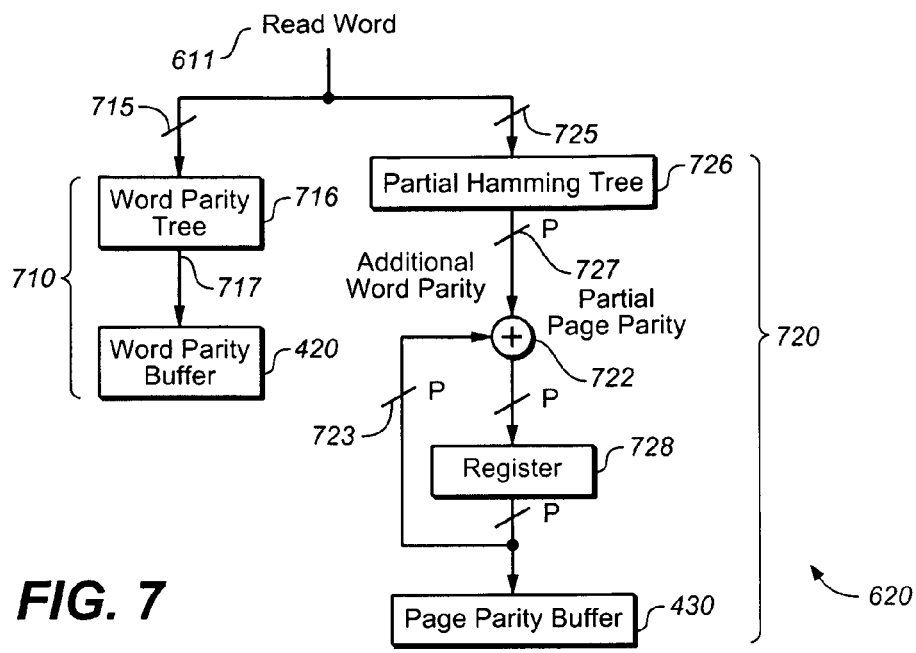
FIG. 7 sets forth a detailed parity encoder structure in accordance with an implementation.

FIG. 7 sets forth a detailed parity encoder 620 in accordance with an implementation. The parity encoder 620 receives the words via line 611 and comprises two branches, one for the word parity calculation 710 and another for the page parity calculation at 720. The word parity calculation branch 710 processes a word 715 of "k" bits and provides an output on 1 bit as shown at 717. The word parity tree 716 is a simple XOR tree between all of the bits of the word (i.e., computation of the word with the column-vector "P"). At the end of this step, the output is sent to the word parity buffer 420.

The second parity calculation branch 720 processes words 725 of "k" bits to provide an output on "p" bits at 727. In the page parity calculation branch 720, the Partial Hamming Tree 726 is a XOR tree that performs the calculation to determine the product of the word with the matrix H (i.e., the partial Hamming Matrix Generator). Operatively, this calculation is repeated for all of the words of the page at 723 and the result is XORed at 722 with previous computation and registered at 728. At the end of this process, the content of the register is sent to the page parity buffer 430. The term "XOR" is well known in the art and refers to an operation that can be executed on two or more binary strings. An exemplary XOR operation includes: (0 XOR 0)=0, (0 XOR 1)=1, (1 XOR 0)=1, (1 XOR 1)=0. Thus, for another example, (0011 XOR 1001)=1010.

An Error Detection/Correction Structure

Figure 8:
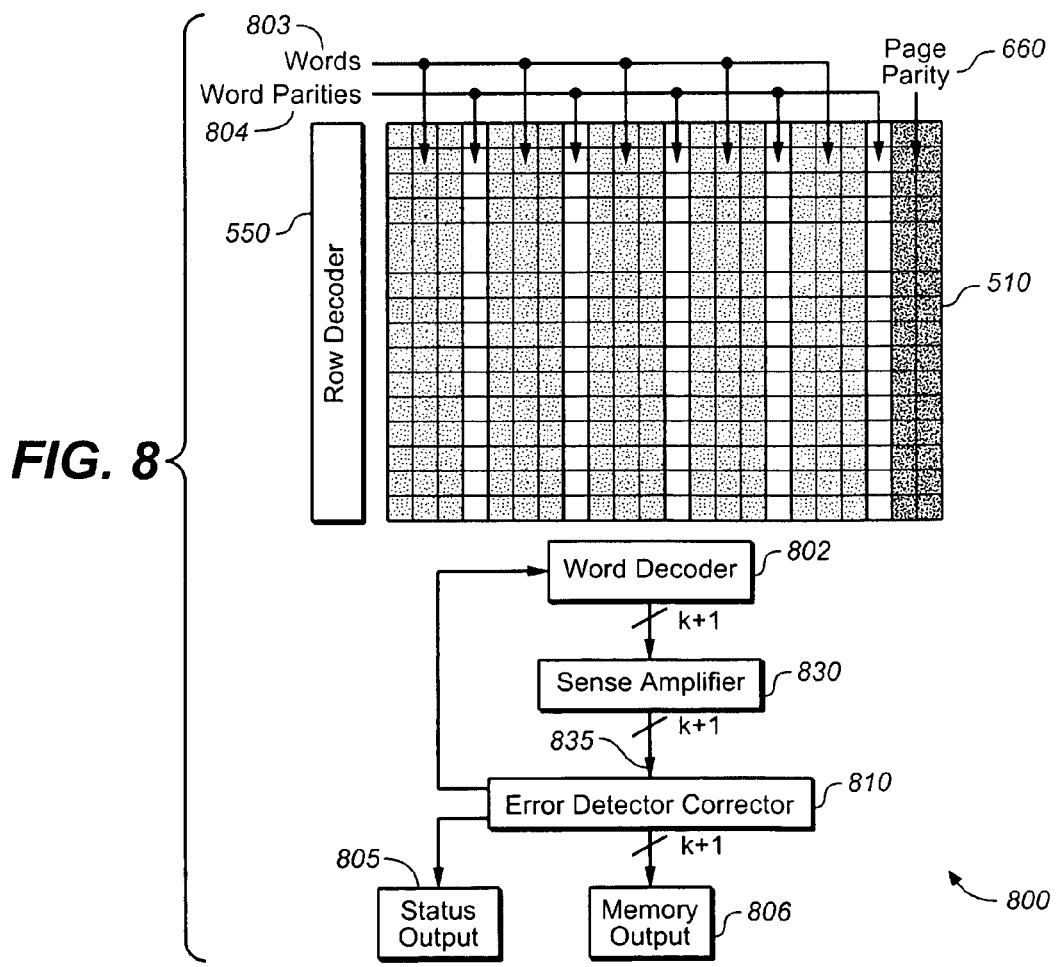
FIG. 8 depicts a memory read structure in accordance with an implementation thereof having a memory array, sense amplifiers, and an error detector/corrector.

It will be appreciated by those skilled in the art that novel solutions concerning the management of the word page are also desired. Using various implementations herein, the management of the word page is also improved by using an error detector/corrector. FIG. 8 depicts a memory read structure 800 in accordance with an implementation thereof having a memory array 510, sense amplifiers 830, and an error detector/corrector 810. In further implementations, an error detector/corrector 810 is inserted after the sense amplifiers 830, as is further illustrated in FIG. 8. A row decoder 550 and word decoder 802 are also presented. Words 803 and word parities 804 are read by the memory array 510 and are decoded by the word decoder 802. Following error decoder correction by the error detector/corrector 810, status (i.e., read done or error notification) is output at the status output 805 and memory information (i.e., read word, corrected word, error sequences) are output at the memory output 806.

Figure 9:
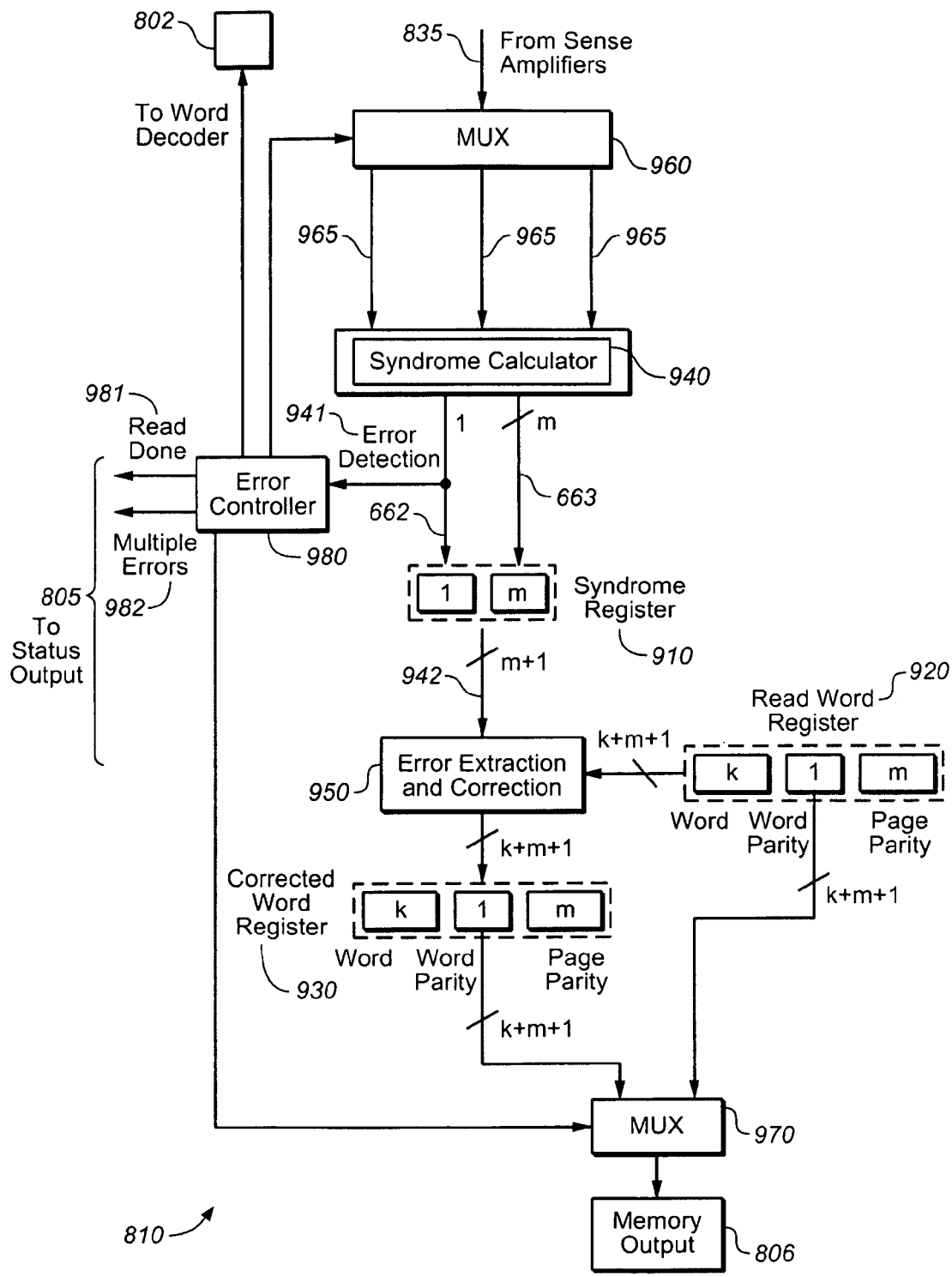
FIG. 9 further depicts a schematic representation of the error detector/corrector of FIG. 8, in accordance with an implementation.

FIG. 9 depicts a schematic representation of the error detector/corrector 810 of FIG. 8, in accordance with an implementation.

From FIG. 9, the error detector/corrector 810 comprises a plurality of registers, including: (1) syndrome register 910 (m+1 bits) for storing the result of the syndrome computation, as further detailed below; (2) read word register 920 (k+m+1 bits) for storing the word that a user wants to read, for instance; and (3) corrected word register 930 (k+m+1 bits) for storing the results of the correction process.

Figure 10:
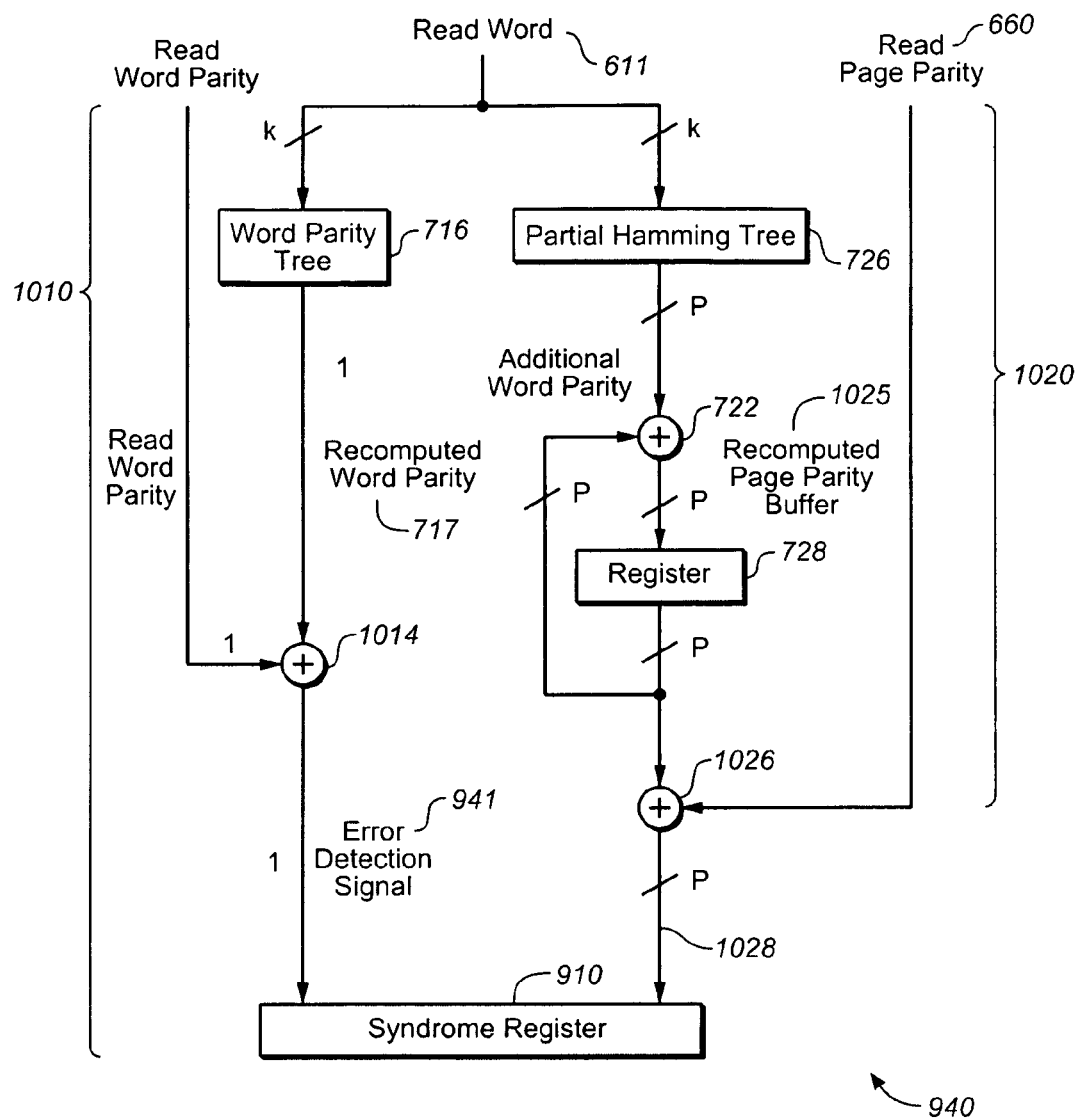
FIG. 10 provides a detailed schematic of the syndrome calculator in accordance with an implementation.

The syndrome calculator 940 of FIG. 9 computes the information of the m+1 bits, and inserts them into the syndrome register 910. The bits contain the information concerning errors. The first bit of the syndrome provides the error detection result of the word that is currently accessed. The first bit of the syndrome is determined to be 1 at 662 if an error has been detected on the word that is currently accessed, while the first bit is determined to be 0 if there is no error detected. The m others bits of the syndrome at 663 provide the rest of the syndrome, once the entire page has been read during a correction process. The syndrome calculator 940 receives data 965 from the sense amplifiers 830 as determined by the input MUX 960 for its calculation. FIG. 10 depicts a detailed schematic of the syndrome calculator 940 in an implementation. Output from the syndrome calculator 940 includes error detection at 941 and both the first bit 662 and the other m bits 663 which are stored in the syndrome register 910. The stored bits in the syndrome register at 910 are output as (m+1) bits at, and are provided to error extraction and correction 950. Additional detail is provided herein under the section "syndrome calculator."

Following the syndrome calculator 940's calculation, the error extraction and correction 950 determines the error pattern and corrects the read word register after the page has been re-read during the correction process. The result of the correction is then placed in the corrected word register 930.

The output multiplexer 970 receives (k+m+1) bits from either the read word register 920 or the corrected word register 930, in response to whether the word has been corrected or not. The output multiplexer 970 outputs the memory information to the memory output at 806. In the event there is no corrected word, the bits will be received from the read word register.

The error controller 980 performs a number of functions including:
  a. sequencing the operation during the error correction process;
  b. checking that only one error or no errors are detected in a page, or, in the alternative, sending an uncorrectable error to the user;
  c. resetting all the registers of the decoder at 802; and
  d. informing a user as to the status output 805 that the read operation is done (i.e., read done) at 981 or that too many errors are present in the page so it cannot be corrected (i.e., multiple errors) at 982.

Syndrome Calculator

FIG. 10 provides a detailed schematic 940 of the syndrome calculator in accordance with an implementation. This syndrome utilizes calculator elements of the parity encoder 700 of FIG. 7. The syndrome calculator 940 is comprised of two branches, similar to those of the parity encoder (700 of FIG.

7), where the first branch 1010 computes the error detection signal for a word and the second branch 1020 computes the p bits of the syndrome.

For the first branch 1010, to compute the error detection signal, the word parity bit is recomputed from the read word 1011 by the word parity tree 716. The recomputed word parity is depicted at 717. Next, the recomputed word parity bit is XORed at 1014 with the read word parity to generate the error detection signal at 941. If the error detection signal is 0, there is no error in the word. If the error detection signal is 1, then there is an error in the word and it is passed to the syndrome register 910.

For the second branch 1020, which computes the p last bits of the syndrome, a re-computation of the page parity is first performed by reading sequentially all the memory words of the page (i.e., similar to the process as the encoding step). When all words are processed, the recomputed page parity is present in the p bits of the recomputed page parity buffer at 1025 and is available in the register 728. Secondly, the page parity is stored in the register 728, then it is read and XORed at 1026 with the content of the register 728 to provide the p last bits of the syndrome at 1028. In this manner, each time a word is read, the first branch is used to detect error in memory words and to signal the error detected to the error controller (i.e., 980 of FIG. 9) via the error detection signal 941. The second branch is used for partial syndrome computation, when error correction is desired.

When the syndrome (i.e., the (m+1) bits) has been computed by the syndrome calculator 940 and latched into the syndrome register 910, it is used in the error extraction and correcting block (i.e., 950 of FIG. 9). An example of implementation of such a block is presented in FIG. 11.

Error Extraction & Correction

Figure 11:
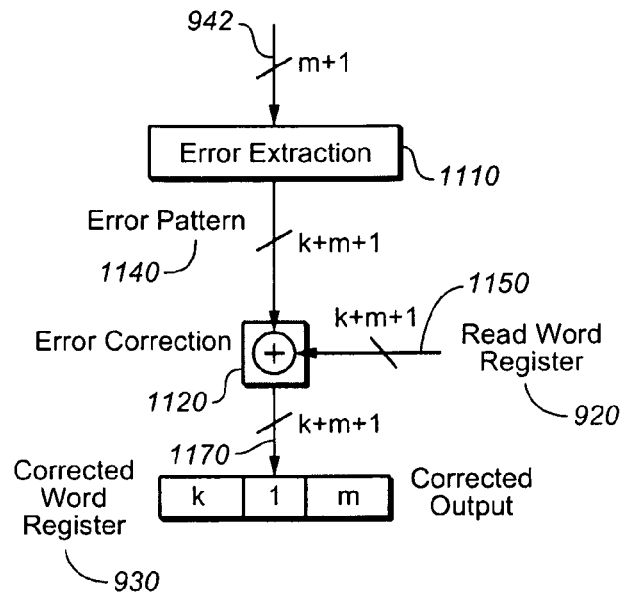
FIG. 11 shows the implementation of when the syndrome has been computed and latched into the syndrome register and is then used in the error extraction and correcting block in accordance with an implementation.

FIG. 11 shows an implementation of when the syndrome 942 has been computed and latched into the syndrome register 910 and is then used in error extraction and correction 950 in accordance with an implementation. From FIG. 11, the error extraction and correction 950 is further comprised of two further blocks: error extraction 1110 and error correction 1120.

Depending on implementation, error extraction 1110 is a combinatorial tree, a Look-Up-Table, or similar. Depending on the value of the syndrome at 942 it returns the corresponding error pattern at 1140. In operation, the size of the combinatorial tree, for various implementations, depends on the word length, not on the page length contradistinctively from a traditional approach involving one page error correction. Further, the error correction block 1120 (bitwise XOR) computes the corrected word by XORing the read word from the read word register 920 with the error pattern of 1140. The result is then sent to the corrected word register 930.

Error Detector/Corrector Sequencing Process

Figure 12:
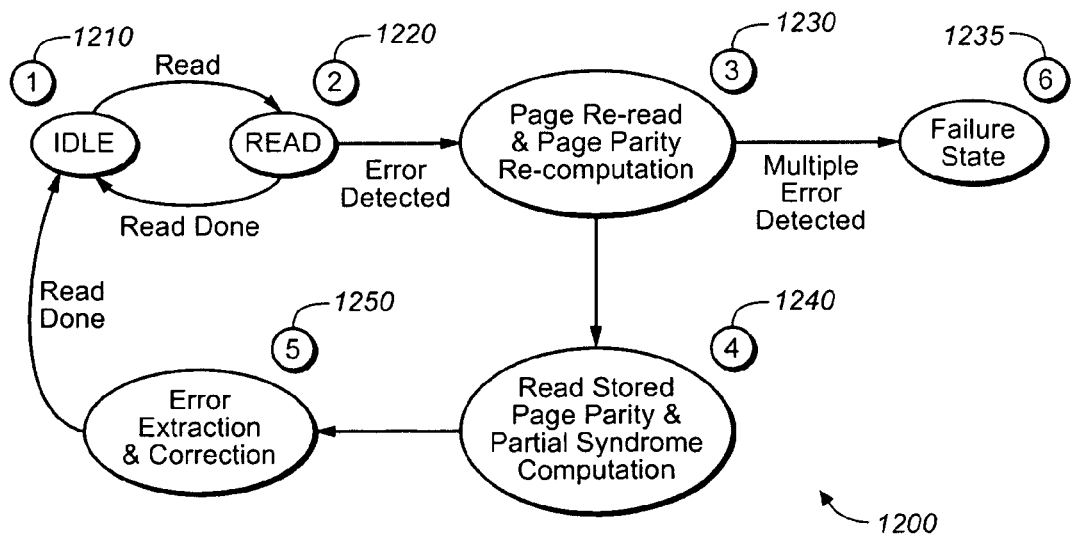
FIG. 12 depicts a method for the error correction in accordance with an implementation.

FIG. 12 depicts a method 1200 for the error correction in accordance with an implementation. The implementation could be that shown in the previous figures but should not be so limited. The method 1200 includes detecting and correcting errors in relation to a memory having differing read/write operations, and comprises the steps of:

1. At 1210, idling the memory to an IDLE state. A user specifies the address of a word to read and launches the memory operation;

2. At 1220, entering the memory to a read mode. In the read mode, the read word and read parity word are read from a memory and stored into the read word register 920 (i.e., from FIG. 9). In parallel, the read word and the read parity word are processed by the first branch of the syndrome calculator 940 to compute the error detection signal. If error detection signal is 0, the read done is signaled by the error controller 980 and is output to the read word register 920. If error detection signal is 1, an error has been detected and the read done signal stays low. The value of the error detection signal is the first bit of the syndrome and is accordingly stored into the first bit of the syndrome register.

3. At 1230, re-reading the page word by word. Words are sent to the syndrome calculator 940 and the page parity is recomputed and stored into the recomputed page parity buffer. During this step, if an error is detected in another word of the page, there are at least two errors in the page, and the error correction process fails. In response, the multiple error signal is set high and the memory enters in a failure state at 1235. The error controller 980 sets the output multiplexer so that the read word register 920 is sent to the output of the memory.

4. At 1240, reading the page parity from the memory and XORing with the recomputed page parity buffer to provide the last p bits of the syndrome. These last p bits are stored into the syndrome register 910. In parallel, the page parity is read from the memory and is stored in the read word register 920. The syndrome determination is completed and has been stored into the syndrome register 910.

5. At 1250, the syndrome is automatically sent to the error extraction and correction 950, where it corrects the read word register 920 from the error and sends the result to the corrected word register. The error controller 980 selects the corrected word register 930 and sends it to the output of the memory. The read done signal is set high.

Additional Capability

A further implementation considers words and groups of words, where a page comprises multiple groups of words. A similar code construction can be derived to detect one error per word and to correct one error per group of words.

Figure 13:
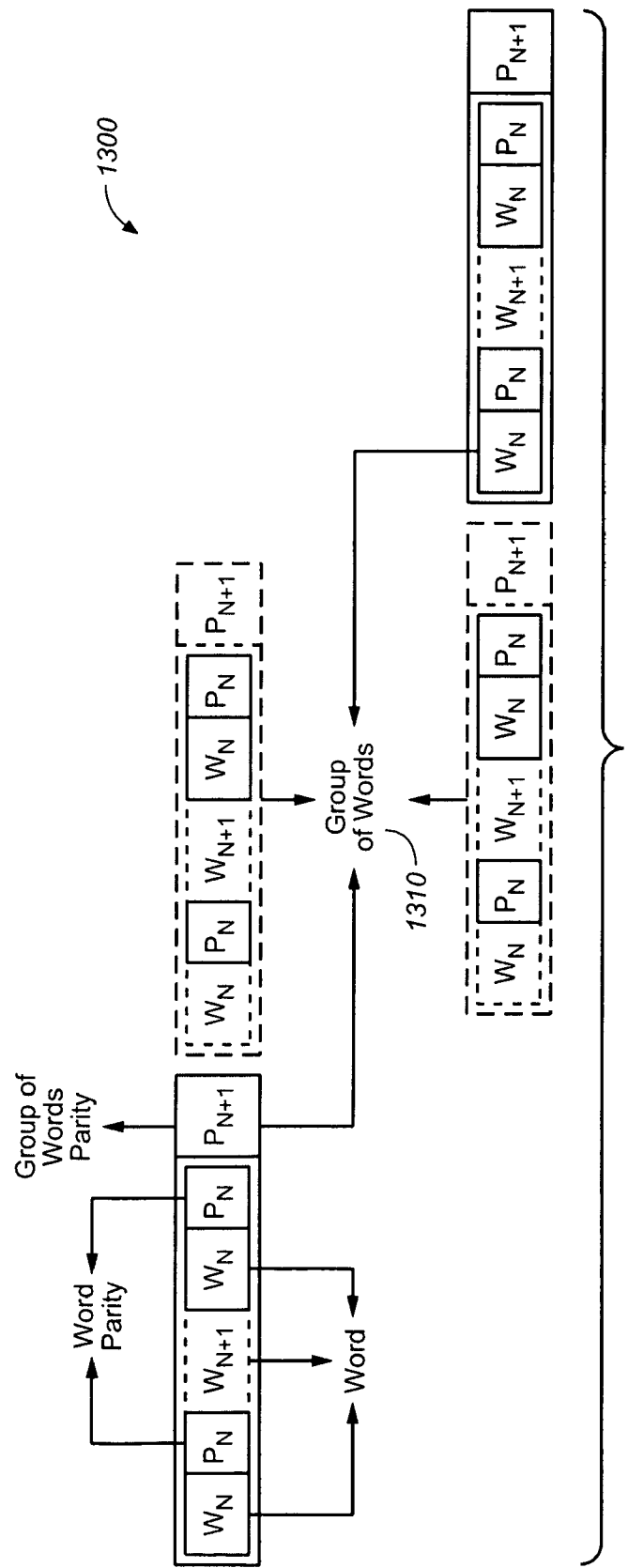
FIG. 13 presents a layout of a page using a correction scheme to detect one error per word and to correct one error per group of words in accordance with an implementation.

FIG. 13 presents a layout 1300 of a page using a correction scheme to detect one error per word and to correct one error per group of words in accordance with an implementation. As previously discussed, due to repeated sub-matrixes in the generator matrix G, the encoder and decoder complexities depend on the length of the word. Therefore, the encoder and decoder structures remain the same without relation to the number of words in a group of words.

Therefore, it will be appreciated by those skilled in the art that various embodiments are able to accommodate other error detection and correction capacities aside from a 1 error detection (1ED) per word and 1 error correction (1EC) per page methodology. For instance, given 1ED per word, it is also possible, in another implementation to construct a 1 error detection (1ED) per word and 1 error correction 2 error detection (1EC2ED) per page code. In such an implementation, an additional column may be added to H (see FIG. 2) and one additional condition may be added to the matrix construction.

It will be appreciated by those skilled in the art that one use of the parity encoder controller in one or more implementations is to reset register of the parity encoder and to sequence the word processing in the parity encoder.

As used herein, the term "flash memory" is well-known in the art and is inclusive but not limited to nonvolatile electrically erasable and programmable read only memory ("EEPROM"), memories which do not need to be refreshed, and other nonvolatile memories. A flash memory system in an implementation/embodiment herein comprises a controller and a flash memory device, wherein the controller further comprises a processor, a memory control portion, and an error detection/correction circuit of one or more embodiments. Further the processor may control the operation of the controller, though software or circuitry may also control the controller. The memory control portion serves as an interface between the controller and the flash memory device. The flash memory device further comprises a memory array and a page buffer, where the memory array further includes a plurality of word lines, a plurality of bit lines, and a plurality of memory cells that are respectively arranged in intersecting portions between the word lines and the bit lines. The memory cells of the memory array are connected to the page buffer via the bit lines. Data that has been externally input is written in the memory array via the page buffer, and data that has been read from the memory array is externally output via the page buffer. Different types of memories are intended to be included in the terms "flash memory" and "memory" herein as well. For instance in these types of memories, including the NOR Flash Memory, the read and write operations differ from one another as a reading operation may be performed on a per word basis while the writing operation may be performed on a per page basis. Other variations of memories having differing read and write operations are also understood by those skilled in the art as well, for instance a memory may also have a reading operation on a "per group of words" granularity while the writing operation is on a "per page" basis (i.e., in combination creating an "operational paradigm" for a memory having read/write operations which differ in their operational behavior).

As used herein, the phrases "having differing read/write operations," "having differing read and write operations," and similar phrases and terms, are intended to mean a situation where a read operation of a memory is of a granularity that is different than that of the programming or writing operation of the memory. For instance, a memory having differing read/write operations exists where the read versus write operations of a memory include a reading operation performed on a "per word" granularity and a writing operation performed on a "per page" basis. Similarly, differing read/write operations also exist for a memory where when compared, the read versus write operations show a difference such as a reading operation on a "group of words" granularity and a writing operation on a "per page" basis. Further, differing read/write operations also exist in a memory where a read operation is performed on a "per word" granularity and a write operation is performed on a "group of words" basis.

As used in various implementations/embodiments herein, the term "generator rules" is defined to include: (1) the number of columns of the matrix providing a one bit parity encoding for word parity computations being equal to the number of words in the page,; and (2) the matrix forming a Hamming Generator matrix with at least two 1's on each line of the matrix where each row is linearly independent from another; accordingly, other variations including modifications and additions hereto are also envisioned.

Although the present invention has been described in accordance with the embodiments shown, one of ordinary skill in the art will readily recognize that there are variations to the embodiments and those variations would be within the spirit and scope of the present invention. Examples of various implementations include memory devices, memory applications, software, firmware, hardware and circuitry, for instance.

Accordingly, many modifications may be made by one of ordinary skill in the art without departing from the spirit and scope of the appended claims.

What is claimed is:

1. A method for error detection and correction in a memory, comprising:
    determining word parity for one or more words on a page of the memory for detecting errors;
    determining a page parity for correcting errors in the page; and,
    detecting and correcting one or more errors by reading the one or more words and writing an output to the memory; wherein parity bits are shared between the word parity and the page parity.

2. The method of claim 1, wherein the reading is performed on a per word basis and the writing is performed on a per page basis.

3. The method of claim 2, further comprising:
    computing shared parity bits for word parity and page parity,
    detecting one or more errors for one or more words on the page by reading one or more words on the page, and
    correcting a detected error by providing a corrected output for the page.

4. The method of claim 1, wherein
    the word parity for one or more words on the page comprises a single parity bit providing for error detection of a word,
    the page parity comprises a plurality of parity bits providing error correction of a detected error in the page, and
    a bit sum of the word parity and the page parity is equal to the computed shared parity bits.

5. The method of claim 1, further comprising computing the parity bits to be shared for word parity and page parity, wherein reading the one or more words is on a per word basis and writing an output to the memory is on a page basis, and the computed parity bits are determined in relation to a matrix construct and a page vector.

6. The method of claim 5, wherein the step of computing the parity bits further comprises
    defining a set of generator rules,
    generating a matrix in relation to the generator rules,
    determining the page vector, and
    computing the product of the matrix and the page vector.

7. The method of claim 1, further comprising
    computing shared parity bits for word parity and page parity,
    determining word parity for each group of words on the page,
    detecting one or more errors for each group of words on the page by reading each group of words on the page, and
    correcting a detected error by writing a corrected output for the page, wherein the reading is performed on a per group of words basis and the writing is performed on a per page basis.

8. The method of claim 7, wherein
    the one or more words are a group of words such that word parity is for a group of words and comprises a plurality of the parity bits for error detection of the group of words,
    page parity comprises a plurality of parity bits for error correction of a detected error in the page, and
    a sum of the parity bits of the word parity and the page parity is equal to the computed parity bits shared between the word parity and page parity.

9. The method of claim 1, further comprising
    computing shared parity bits for word parity and page parity,
    determining word parity for each word on the page,
    detecting one or more errors for each word on the page by reading each word on the page, and
    correcting a detected error by determining a corrected output for a group of words on the page, wherein the reading is performed on a per word basis and the writing is performed on a per group of words basis.

10. The method of claim 9, wherein
the word parity comprises a single parity bit providing for error detection of the word,
the page parity comprises a plurality of parity bits for error correction of a detected error in the page, and
a sum of the parity bits of the word parity and the page parity is equal to the computed parity bits shared between the word parity and page parity.

11. The method of claim 1, wherein a computation of the parity bits is performed by an encoder comprising a method of
computing the parity bits in relation to a matrix construct and a page vector including defining a set of generator rules,
generating a matrix in relation to the generator rules, determining the page vector, and
computing the product of the matrix and the page vector, wherein a computed parity bits is equal to the sum of the word parity bits and the page parity bits.

12. The method of claim 11, wherein the generator rules comprise: limiting a number of columns of the matrix, providing a one bit parity encoding for word parity computations, to be equal to a number of words in the page; and the generated matrix forms a Hamming Generator matrix with at least two 1's on each line of the generated matrix such that each row is linearly independent from another.

13. The method of claim 1, further comprising
loading words intended for writing to the memory into a word buffer of a page buffer in signal communication with the memory,
issuing a command to write the loaded words to a predetermined address, and
writing the loaded words to the memory, wherein the reading is performed on a per word basis and the writing is performed on a per page basis.

14. The method of claim 13, further comprising sending a corrected output to a corrected word register.

15. The method of claim 1, further comprising the steps of:
detecting one error per word and performing one error correction of the error detected on a page by computing the shared parity bits for word parity and page parity;
determining word parity for each word on the page;
detecting one or more errors for each word on the page by reading each word on the page; and
correcting errors for two or more detected errors by determining a corrected output, wherein the reading is performed on a per word basis and the writing is performed on a per page basis.

16. A flash memory system having a flash memory device including a memory array, a word buffer, one or more parity buffers, and a parity encoder controlled by a parity encoder controller, and being capable of determining error detection and error correction for the memory array by:
computing a word parity for each of one or more words on a page of the memory array for detecting errors;
computing a page parity for correcting the errors in the page; and
detecting and correcting one or more errors of the one or more words by reading each of the one or more words, and providing an output.

17. The system of claim 16, further comprising:
computing shared parity bits for word parity and page parity,
determining word parity for the one or more words on the page,
detecting one or more errors for the one or more words on the page by reading one or more words on the page, and
correcting a detected error by providing a corrected output, wherein the memory array is a NOR Flash Memory and performs reading on a per word basis and writing on a per page basis.

18. The system of claim 17, wherein the computed parity bits
are determined in relation to a matrix construct and a page vector and
further comprise the steps of defining a set of generator rules, generating a matrix in relation to the generator rules, determining the page vector, and computing the product of the matrix and the page vector.

19. A process for detecting and correcting errors comprising:
idling the memory,
entering a read mode for the memory,
specifying an address of one or more words to read on a page of the memory,
computing an error detection signal being a first bit of a syndrome, by a syndrome calculator,
re-reading the page by re-reading each of the one or more words and determining page parity,
determining other bits of the syndrome for correcting the error, and
outputting a corrected word to the memory.

20. The process of claim 19, further comprising generating error detection and correcting code for performing the process, wherein the code is generated in relation to a read operation and a write operation of the memory.

21. The process of claim 20, further comprising setting a read done signal to a high setting when the error detection signal is of a value of zero.

22. The process of claim 20, wherein the step of re-reading the page further comprises: sending one or more words to the syndrome calculator to re-compute the page parity and storing the page parity into a recomputed page parity buffer.

23. The process of claim 20, further comprising automatically sending the syndrome for error extraction and correction.

24. A computer program product for detecting errors and correcting errors in a memory having a read operation differing from a write operation, the computer program product comprising a computer-readable storage medium having computer-readable program code portions stored therein, the computer-readable program code portions comprising: a first executable portion capable of,
determining word parity for each of one or more words on a page of the memory for detecting errors;
determining a page parity for correcting errors in the page; and
detecting and correcting one or more errors by reading each of the one or more words and writing an output to the memory,
wherein parity bits are shared between the word parity and the page parity, and reading is performed on a per word basis and writing is performed on a per page basis.

25. The product of claim 24, further comprising computing shared parity bits for word parity and page parity, determining word parity for one or more words on the page, detecting one or more errors for one or more words on the page by reading one or more words on the page, and correcting a detected error by determining a corrected output.

* * * * *

UNITED STATES PATENT AND TRADEMARK OFFICE
CERTIFICATE OF CORRECTION

| | | |
|---|---|---|
| PATENT NO. | : 8,112,699 B2 | Page 1 of 1 |
| APPLICATION NO. | : 12/031289 | |
| DATED | : February 7, 2012 | |
| INVENTOR(S) | : Godard Benoit and Jean-Michel Daga | |

It is certified that error appears in the above-identified patent and that said Letters Patent is hereby corrected as shown below:

Cover Page; (75) Inventors: Jean Michael Daga; delete "Pynier (FR)" and insert
-- Peynier (FR) --

Column 2; line 29; delete "implementation;" and insert -- implementation. --

Signed and Sealed this
Eighth Day of May, 2012

David J. Kappos
*Director of the United States Patent and Trademark Office*